United States Patent [19]

Pierrot

[11] 4,387,347
[45] Jun. 7, 1983

[54] DELAY LINE FREQUENCY DISCRIMINATOR FOR STABILIZING AN OSCILLATOR

[75] Inventor: Robert Pierrot, Paris, France
[73] Assignee: Thomson-CSF, Paris, France
[21] Appl. No.: 130,474
[22] Filed: Mar. 14, 1980

[30] Foreign Application Priority Data

Mar. 16, 1979 [FR] France .................... 79 06745
Jan. 29, 1980 [FR] France .................... 80 01896

[51] Int. Cl.³ ................................ H03L 7/04
[52] U.S. Cl. .................... 331/1 R; 307/519; 328/141; 331/9
[58] Field of Search ......... 307/510, 519; 328/140, 328/141; 331/1 R, 9; 329/137, 145

[56] References Cited

U.S. PATENT DOCUMENTS 3,479,600 11/1969 Miller .................... 375/80
3,530,387 9/1970 Bonfeld et al. .......... 329/116
3,604,002 9/1971 Fling .................... 331/9 X
4,032,858 6/1977 Hargis .................... 331/9
4,048,580 9/1977 Campbell et al. ......... 331/1 R

FOREIGN PATENT DOCUMENTS 2720240 11/1978 Fed. Rep. of Germany .
1539536 9/1968 France .
2003057 2/1969 France .

Primary Examiner—Siegfried H. Grimm
Attorney, Agent, or Firm—Oblon, Fisher, Spivak, McClelland & Maier

[57] ABSTRACT

A delay line frequency discriminator having application to microwave equipment and particularly used for stabilizing an oscillator, including a first coupler supplied by the oscillator and connected to a second coupler by means of two electromagnetic transmission lines, wherein one of the transmission lines introduces a delay time $\tau$ compared with the other line. The second coupler delivers a sum signal which is the stabilized output signal of the oscillator and a difference signal to a third coupler which is also fed with a sampled portion of the output signal of the oscillator and supplies the oscillator via a detector and an amplifier.

8 Claims, 6 Drawing Figures

DELAY LINE FREQUENCY DISCRIMINATOR FOR STABILIZING AN OSCILLATOR

BACKGROUND OF THE INVENTION

The present invention relates to a delay line frequency discirminator, more particularly used for stabilizing an oscillator in a microwave equipment.

The low power oscillator used in the microwave equipments and requiring a good frequency stability are often of the quartz type. They then have at least one stage supplying a signal at a frequency corresponding to the selected crystal followed by a frequency multiplier making it possible to obtain frequencies of approximately 10 GHz. The output of this frequency multiplier is often connected to an amplifier making it possible to obtain the desired power. However, these oscillators have two disadvantages which can cause problems in certain equipment. On the one hand the frequency is fixed and on the other hand the phase noise inherent in the basic quartz oscillator rises in proportion to the frequency multiplication, which is disturbing in the case of very high frequencies.

It is also possible to use resonant circuit oscillators comparable to those used in radio equipment operating at medium and high frequencies. In the microwave frequency range they can include cavities or line resonators on a substrate using the so-called microstrip or "stripline" technology, with active elements such as Gunn or avalanche diodes. However, these oscillators do not have an adequate phase and frequency stability for certain equipment.

According to the prior art, this frequency stability of line oscillators and active elements of for example the Gunn or avalanche diode type is obtained by means of a frequency locking loop using an acoustic delay line. In this way, so-called noise compression oscillators are obtained.

These acoustic lines are expensive and are at present limited to frequencies in the X band in which quartz oscillators have better noise, frequency and phase performances. Moreover, their power is greatly limited and their losses can rise to 30 or 40 dB, whilst also causing a significant delay $\tau$ creating ambiguities in the reference frequency equal to $1/\tau$. This ambiguity can be every 2 MHz if $\tau = 0.5\mu$ sec.

BRIEF SUMMARY OF THE INVENTION

The object of the present invention is a frequency discriminator carrying out the phase locking of the oscillator to which it is connected. One advantage of such a discriminator is to avoid using acoustic lines which limit the oscillators to frequencies of 10 GHz.

The frequency discriminator according to the invention comprises at least a first coupling means connected to the output of the oscillating circuit with which it is associated supplying at its two outputs a wave of amplitude A corresponding to half the power supplied by the oscillator, a second coupling means connected to the first by a direct connection introducing a delay $\tau$ compared with the direct connection, whereby one of the two outlets of the second coupling means supplies a signal $\Sigma$ representing the sum of the signals applied to its inputs and the second output supplying a difference signal $\Delta$ of the signal supplied to its inputs, a third coupling means connected to the output of the second means and also receiving a signal from a fourth coupler mounted on channel $\Sigma$ and sampling a small part of the energy from said channel $\Sigma$, the output or outputs of said third coupling means being connected to a detection circuit.

BRIEF DESCRIPTION OF THE DRAWINGS

Other advantages and features of the present invention can be gathered from the following description with reference to the drawings, wherein are shown.

DETAILED DESCRIPTION OF THE PREFERRED EMBODIMENTS

Figure 1:
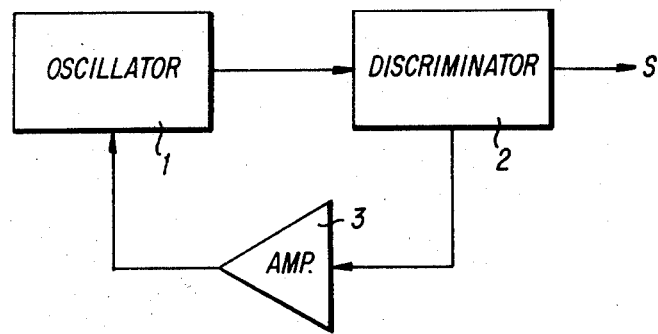
FIG. 1 is a general block diagram of an oscillator stabilized by a frequency discriminator.

An oscillator with a frequency locking loop controlled by a frequency discriminator circuit is shown by the block diagram of FIG. 1.

It comprises the oscillator circuit 1 itself, whose output is connected to the input of a frequency discriminator 2. At the output S the discriminator 2 supplies the frequency stabilized wave at the second output a signal, the amplitude of which varies with the frequency deviation compared with the tuning frequency and which is applied to the input of an amplifier 3. The output of the latter is connected to the frequency control of the oscillator circuit 1.

Figure 2:
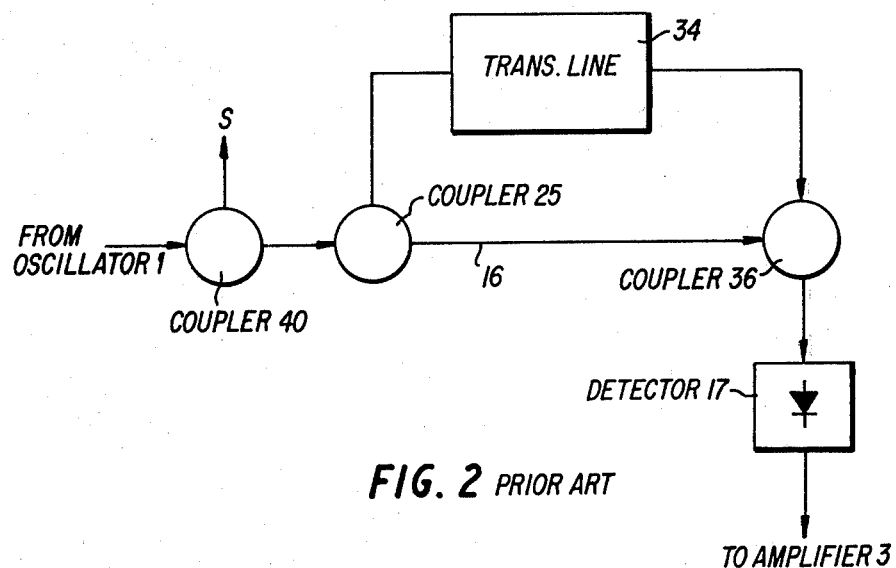
FIG. 2 is a diagram of a frequency discriminator according to the prior art, using an acoustic line and mounted in the oscillator of FIG. 1.

The operation of such a stabilized oscillator is described hereinafter with reference to FIG. 2 representing a frequency discriminator according to the prior art. Discriminator 2 receives the output signal of the oscillator 1 and compares the frequency f of the latter with a reference frequency $f_o$ determined by a delay line 34 having a delay $\tau$. A signal, the amplitude of which is a function of the frequency deviation $(f - f_o)$ makes it possible to vary the frequency f of oscillator 1 by acting for example on the voltage of a varactor diode.

FIG. 2 shows a diagram of a frequency discriminator 2 of prior art used in the stabilized oscillator of FIG. 1. It incorporates a coupler 40 supplying the useful output signal to a terminal S and a coupler 25 dividing the incident wave into two waves of unequal power and therefore of different amplitude. The coupler 25 is connected to two transmission lines 34 and 16. The shorter line 16 is a line which directly transmits the electromagnetic wave from coupler 25 to the first input of a second coupler 36. The second line 34 is an acoustic line having at its input a transducer transmitter, which converts the electromagnetic wave into an ultrasonic wave and at its output a transducer receiver which reconverts the ultrasonic wave into an electromagnetic wave, which is applied to the second input of coupler 36. The velocity of the sound waves in a random medium is much lower than the velocity of the electromagnetic waves in a transmission line, so that the waves from the transmission line 34 are delayed by a long time $\tau$ compared with those from the transmission line 16. The signal from coupler 36 is converted into a signal, the amplitude of which increases with the frequency deviation $f-f_o$ by means of a detector circuit 17. In this example, $f_o$ is determined by a phase coincidence of the two waves at the inputs of coupler 36, therefore by the relationship $f_o=k(1/\tau)$ which k is a positive integer.

The acoustic lines introduce a long delay $\tau$ due to the very considerable velocity difference, the latter reaching values of approximately 0.5 $\mu$sec. This high value of $\tau$ thus causes an ambiguity on frequency $f_o$, which in the preceding example is repeated every 2 MHz. The amplitude of the output signal of the detector 17 is equal to A sin $\phi$ in which $\phi=2\pi(f-f_o)\tau$. In general, this expression can be written A$\phi$, because the angle remains sufficiently small as a result of the value of the product $\tau(f-f_o)$. If the delay $\tau$ is so reduced that the ambiguous frequencies are more spaced, the product A$\phi$ decreases, which leads to a reduction of the loop gain. Moreover, the detector, for example constituted by Schottky diodes, is always power limited, which therefore leads to a limitation of A, which accentuates the loss of sensitivity of the loop, which is a function of the amplitude of the signal at the input of amplifier 3.

The disadvantages of the prior art equipment are therefore largely dependent on the use of an acoustic line and on the limited power which can be applied to the input of detector 17.

Figure 3:
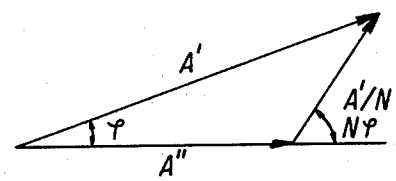
FIG. 3 is a vector diagram illustrating the operations performed by the apparatus according to the invention.

The apparatus according to the invention obviates these disadvantages. The acoustic delay line is replaced by an electromagnetic transmission line 4 which also introduces a delay $\tau$, which can for example be 5 ns, but which is much smaller than that introduced by the acoustic line. However, the advantage of the electromagnetic line is to avoid losses and power limitations which are inherent in acoustic lines. The introduction of such an electromagnetic line also leads to a widening of the spacing between the ambiguous frequencies and to a reduction of the phase shift $\phi$ between the lines 4 and 16 and therefore of the output signal A$\phi$ of coupler 6. Such a modification would appear to be of small interest as it tends to reduce still more the sensitivity at the detector 7. The present invention allows this disadvantage to be obviated and FIG. 3 shows how this is accomplished. If A' and A" are the amplitudes, which are a priori slightly different, of the signals appearing on lines 4 and 16, the amplitude of the output signal of the detector 7 is given by:

$$|\Delta|=A' \sin \phi \# A'\phi$$

if the phase shift $\phi$ introduced by the lines 4 and 16 is small, as indicated hereinbefore. When introducing a random positive integer N this expression can be written:

$$|\Delta|\#(A'/N)\cdot(N\phi)$$

Thus to increase the amplitude of the signals from the oscillator 1 amounts to increasing the phase $\phi$. Accordingly, the replacement of the acoustic line by an electromagnetic line allows the power at coupler 6 to be considerably increased and therefore the amplitude A' by a factor N', but this could lead to the destruction of detector 7. Thus it has been necessary to introduce another coupler 12 which processes the signal $\Delta$ having an average amplitude equal to:

$$|\Delta|=(A'(N'/N))\cdot(N\phi)$$

The coupler 6 is supplied with this output signal of coupler 12 as well as with a signal from the oscillator 1 or from the output channel $\Sigma$ of the coupler 12. The detector 7 is connected at the output of coupler 6.

Thus, in this new arrangement, the processing is equivalent to a phase multiplication, which increases the sensitivity of the discriminator. Such a processing is not dangerous for the detector 7, as at the input of the coupler 6 the power is much higher than that at the input of coupler 36 of FIG. 2 according to the prior art and therefore a fortiori its output power is sufficiently low to prevent the detector 7 from being destroyed.

Figure 4:
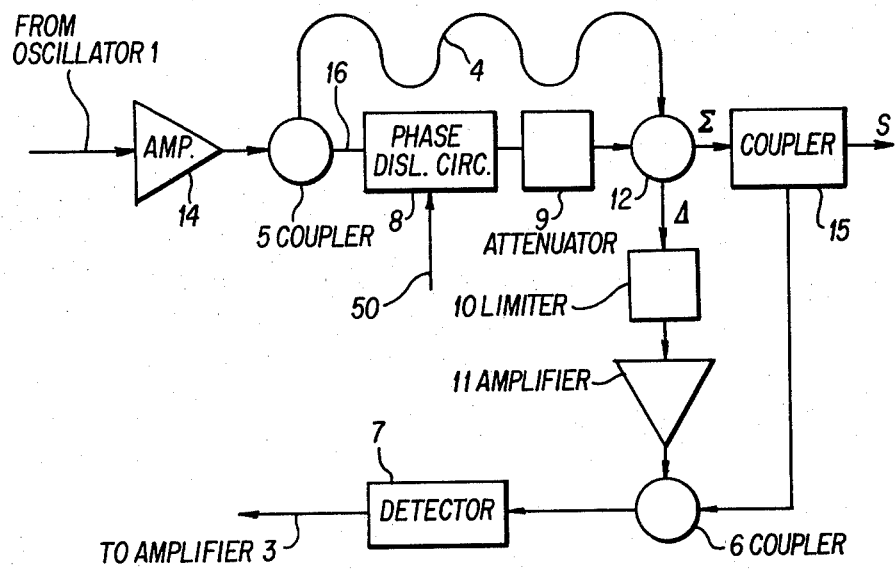
FIG. 4 is a detailed diagram of the frequency discriminator according to the invention.

FIG. 4 is a detailed diagram of an apparatus according to the invention and carrying out the above-described processing. It comprises an amplifier 14 receiving the output of the oscillator 1 and the output of which is connected to a coupler 5. The outputs of the coupler 5 are connected to a delay line 4 and to a line 16 which is of the same type but shorter than line 4 in which a phase shifting circuit 8 with an external control 50 and an attenuator 9 are inserted in series. The output of the two lines 4 and 16 is connected to a coupling circuit 12 which, on two channels $\Sigma$ and $\Delta$, delivers signals corresponding respectively to the sum and to the difference of the two input signals. The channels $\Sigma$ is connected to the coupler 15, the output of which delivers the useful signals and the channel $\Delta$ to a coupler 6 via a limiting circuit 10 in series with a low noise amplifier 11. The second input of the coupler 6 receives the signal derived by coupler 15. The output or outputs of coupler 6 are connected to detector circuit 7.

The present apparatus functions as follows. The signal of frequency f from the oscillator 1 is amplified by the amplifier 14. The coupler 5 distributes equally the power to the two lines 4 and 16. As the line 4 is longer than the line 16, it introduces a delay $\tau$ compared with the line 16. This delay can be adjusted by using the phase shifting circuit 8, which modifies the tuning frequency of the oscillator 1. The attenuator 9 makes it possible to give the same amplitude to the two signals delivered by the lines 4 and 16 to the coupler 12. The channel $\Sigma$ of the coupler 12 then delivers a wave, the amplitude of which depends only on the oscillator 1 and on the amplifier 14, except for the losses of lines 4 and 16. The channel $\Delta$ supplies a signal, the amplitude of which is small when the loop is locked, due to the vector difference of the two waves. The limiting circuit 10 limits the energy transmission in channel $\Delta$, so that the downstream circuits, like the detector circuit 7, cannot be destroyed. There may in fact be a high power level on the channel $\Delta$ during the locking of the frequency loop, as the signal $\Delta$ can then be very high due to the deviation at the time of starting.

The low noise amplifier 11 makes it possible to obtain a higher signal, so that the noise inherent in the detector 7 and the amplifier 3 can be disregarded. Thus, the amplitude of the input signals of the coupler 6 can be compared with that of the input signals of the coupler 36 in the prior art embodiments as shown in FIG. 2.

As a result there is a high power at the output of the coupler 15 and only a small part thereof is used for carrying out the detection, so that the destruction of the detection circuit 7 can be avoided. Moreover, if A' is the amplitude of the signals from lines 4 and 16 (A' differing slightly from A") and $\phi$ their phase difference, a signal of amplitude G'A'$\phi$ is obtained at the input of the coupler 6, G' being the gain of the amplifier 11. The amplitude of the signal derived from the coupler 15 and applied to the input of coupler 6 must be much higher than G'A'φ, for example 10 dB higher. G'A'φ is calculated so as to be as high as possible within the limits accepted by the detector 7.

Thus, the output of the coupler 6 supplies a signal as a function of φ and having a high amplitude, which remains acceptable to the detector 7. The amplifier 11 connected via the limiter 10 in the output channel Δ of the coupler 12 reduces the noise of the frequency locking loop.

The noise is essentially due to the detector 7 and to the amplifier. Thus if a part of the gain of the amplifier 3 is provided by the amplifier 11, which is so designed that it has a lower noise level than the amplifier 3, the total noise of the loop decreases as it is well known that the noise in an amplification chain only depends on the first stage in as far as the gain of the first stage is sufficient.

Figure 5:
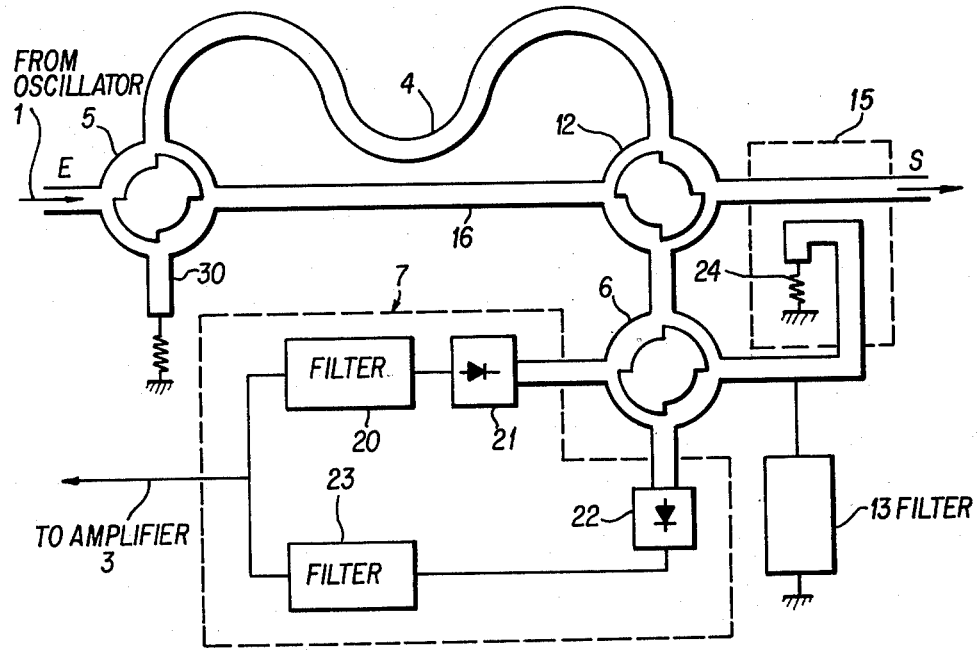
FIG. 5 is a non-limitative exemplified embodiment of the frequency discriminator according to the invention.

A non-limitative embodiment of the apparatus according to the invention is shown in FIG. 5 which only represents the strictly necessary elements provided on a substrate in the microstrip or "stripline" technology. It includes the elements of FIG. 4, except the amplifiers 11 and 14, the limiter 10, the phase shifting circuit 8 and the attenuator 9. The detector 7 includes two diodes, 21 and 22 respectively, for example Schottky diodes connected with inverted polarities between each output of the coupler 6 and a low pass filter 20, 23, respectively, thus smoothing the detected signal. The outputs of the filters 20 and 23 are interconnected and applied to the input of the amplifier 3 of FIG. 1. A low pass filter 13 ensures the ground return of the detector 7. Coupler 15 has two line sections which are sufficiently close to establish a low coupling and one of these sections, namely that connected to the coupler 6, has its second end grounded via a resistor 24, which prevents wave reflections. In the same way, coupler 5 has four accesses, one of which has an adapted load so as to prevent wave reflections in lines 4 and 16. The couplers 6 and 12 are hybrid couplers with four inputs or outputs having a well known configuration characteristic of construction on a substrate in the microstrip or stripline technology.

Thus, according to the invention, the delay time τ between lines 4 and 16 is very short, for example 5 ns. This corresponds to a frequency ambiguity of 200 MHz. This ambiguity much greater than in the prior art, is also an advantage of the apparatus according to the invention and also permits a wide band scanning of the oscillator by varying the tuning frequency of the discriminator for example by means of a phase shifter.

Moreover, the frequency discriminator according to the invention is much less expensive as it does not use an acoustic line.

The apparatus according to the invention can also use wave guides. The power can then be higher and the couplers 5, 6 and 12 are for example magic T-circuits.

The coupler 15, described in FIGS. 4 and 5, can be inserted between the output of the oscillator 1 and the input of the coupler 5.

Figure 6:
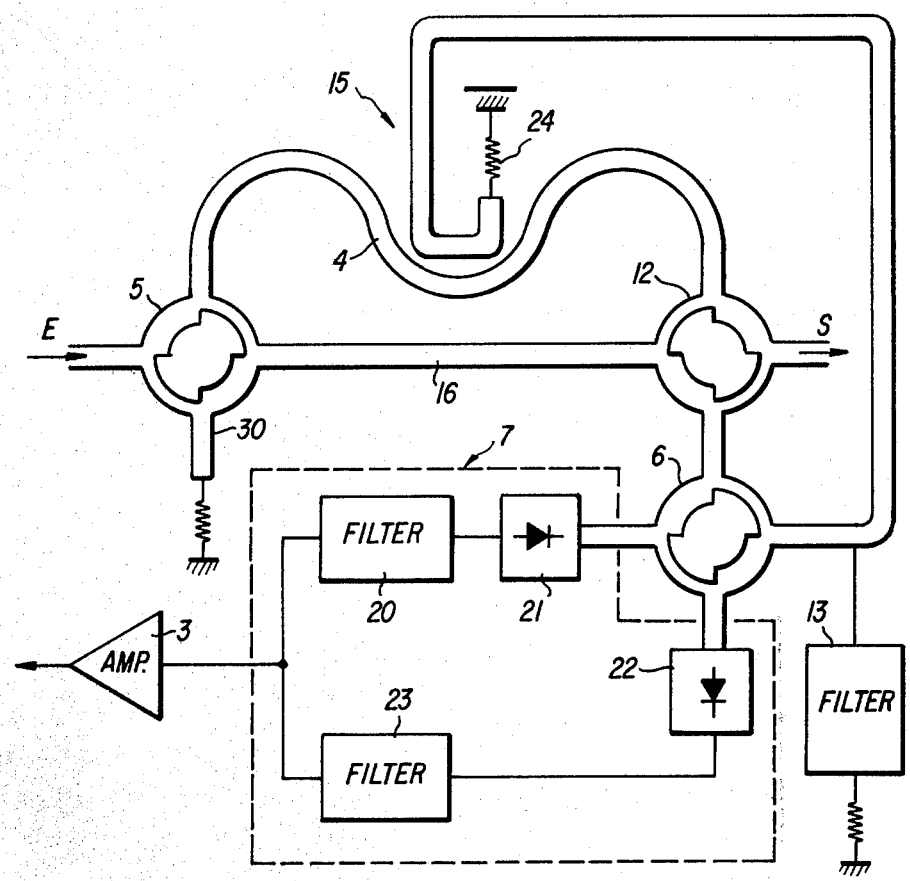
FIG. 6 is a non-limitative exemplified alternative embodiment of the frequency discriminator according to the invention.

In another embodiment of the apparatus according to the invention, which is shown in FIG. 6, the coupler 15 can be inserted between the two couplers 5 and 12 on one of the two transmission lines 4 or 16. In a preferred but non-limitative embodiment, the coupler 15 is inserted in the middle of the transmission line 4, as shown in FIG. 6 which introduces a predetermined time delay τ, or in the middle of the direct transmission line 16. In fact, the coupler 15 can be inserted anywhere on the transmission lines but the aforementioned particular position of the coupler 15 allows the first frequency ambiguity to be enough shifted to make the frequency range of the discriminator without ambiguity twice as large as the frequency range of the discriminator, in which the coupler 15 is not provided on the transmission lines 4, 16.

Thus, a frequency discriminator has been described, the frequency and input power limits of which are much higher thus allowing the phase deviations and therefore the frequency deviations compared with the reference frequency given by the delay time τ of the transmission lines 4 and 16 to be more precise, due to an increase of the power.

What is claimed is:

1. A frequency discriminator for stabilizing an oscillator, comprising:

first coupling means having an input fed with an oscillator signal to be frequency-stabilized and having first and second outputs which are each supplied with a wave of amplitude A corresponding to half the power of the oscillator signal fed to the input, said first coupling means comprising a first connecting means and a second connecting means including an electromagnetic transmission line respectively connected to said first and second outputs, said second connecting means introducing a delay t compared with said first connecting means, said delay t determining a tuning frequency;

second coupling means having first and second inputs respectively coupled to outputs of said first and second connecting means for delivering a summation output signal representing the vectorial sum of the signals applied to said second coupling means from said first and second connecting means, said summation output signal corresponding to the stabilized output signal of said oscillator, said second coupling means also producing a difference output signal representing the vectorial difference of said two signals applied to said second coupling means from said first and second connecting means;

third coupling means having a first input coupled to said difference output signal of said second coupling means;

fourth coupling means for deriving a signal based on a sampling of said oscillator signal sampled at a selected point in a selected one of said first or second connecting means, and supplying a second input of said third coupling means with said derived signal; and a detector connected to an output of said third coupling means and delivering a frequency control signal having an amplitude dependent on the frequency deviation of said oscillator compared with the predetermined tuning frequency.

2. A frequency discriminator according to claim 1, wherein said first connecting means further comprises:

a phase shifter having an external control input for varying the delay time t of said second connecting means compared with said first connecting means and therefore for varying the tuning frequency of said oscillator.

3. A frequency discriminator according to claim 1, further comprising:

a first amplifier connected between the output of said oscillator and the input of said first coupling means.

4. A frequency discriminator according to claim 1, wherein said first connecting means further comprises:

an attenuator for making the amplitude of the signal on the first input of said second coupling means equal to that of the signal on the second input of said second coupling means.

5. A frequency discriminator according to claim 1, further comprising:

a power limiting circuit connected between the second output of said second coupling means and the first input of said third coupling means for preventing the downstream circuits from being destroyed.

6. A frequency discriminator according to claim 1, further comprising:

a low noise amplifier between the second output of said second coupling means and the first input of said third coupling means.

7. A frequency discriminator according to claim 1, wherein said first, second and third coupling means are hybrid couplers having four inputs or outputs.

8. A noise compression oscillator stabilized by a frequency discriminator according to claim 1, comprising:

an output delivering a signal with which the input of said first coupling means is supplied and a frequency control input fed with the output signal of said detector via an amplifier.

* * * * *